United States Patent

Winnard

[15] 3,693,032

[45] Sept. 19, 1972

[54] ANTISATURATION TECHNIQUE FOR TTL CIRCUITS

[72] Inventor: James R. Winnard, Poughkeepsie, N.Y.

[73] Assignee: International Business Machines Corporation, Armonk, N.Y.

[22] Filed: April 23, 1971

[21] Appl. No.: 136,699

[52] U.S. Cl...................................307/299, 307/215

[51] Int. Cl...............................................H03k 3/26

[58] Field of Search......................307/299, 300, 215

[56] References Cited

UNITED STATES PATENTS

| | | | |
|---|---|---|---|
| 3,534,281 | 10/1970 | Hillhouse | 307/300 |
| 3,473,045 | 10/1969 | Niemann | 307/299 |
| 3,473,047 | 10/1969 | Bohn et al. | 307/215 |
| 3,512,016 | 5/1970 | Huang et al. | 307/300 |

OTHER PUBLICATIONS

Electronic Design, Vol. 19, No. 8, Apr. 15, 1971, " Taking a Look Inside the TTL IC." by Ury, pages 68–71

*Primary Examiner*—James W. Lawrence
*Assistant Examiner*—Harold A. Dixon
*Attorney*—Hanifin and Jancin and James E. Murray

[57] ABSTRACT

This specification discloses a technique of saturation control for a transistor transistor logic (TTL) circuit. The saturation control device includes an additional emitter of the input transistor which is connected to the collector of the output transistor.

2 Claims, 4 Drawing Figures

INVENTOR
JAMES R. WINNARD

BY James T. Murray

ATTORNEY

ANTISATURATION TECHNIQUE FOR TTL CIRCUITS

BACKGROUND OF THE INVENTION

This specification relates to logic circuits and more particularly to the transistor saturation in logic circuits.

Monolithic transistor transistor logic circuits are widely used because they offer a good trade-off between performance, power dissipation, functional density on the monolithic chip, and logic flexibility. However, in TTL circuits, high drive currents are used to drive the output transistor hard in order to obtain a fast turn-on transition. The high drive currents cause excessive charge to be stored in the output transistor thereby resulting in heavy saturation of the output transistor and a consequent long turn-off delay for the TTL circuit. This turn-off delay has prevented the use of TTL circuits in some high speed applications.

To extend the operating range of TTL circuits a number of methods have been proposed to prevent deep saturation in the output transistor. The most useful of these proposed approaches utilizes a Schottky barrier diode in shunt with the base-collector junction of the output transistor to clamp the voltage across the base-collector junction at a relatively low forward voltage. The disadvantage of this technique is that there is additional process complexity in making the Schottky diode when metals other than aluminum are used for the metallic interconnections and there are some noise problems due to the fact that the characteristics of transistor of the TTL circuit and those of the antisaturation Schottky diode do not track each other in the manner of transistors formed on the same monolithic chip.

In accordance with the present invention a technique is provided to overcome the disadvantages mentioned above. In this new technique an additional emitter diffusion is placed in the input transistor of the TTL circuit. This diffusion is then coupled to the collector of the output transistor. With this connection the base drive current for the output transistor is shunted by the base collector junction of the output transistor when the voltage at the collector of the output transistor drops sufficiently to forward bias the emitter base junction of the connected emitter. This technique overcomes the metalization problem involved in using the Schottky barrier diodes and takes advantage of tracking in the characteristics of transistors formed on the same chip.

BRIEF DESCRIPTION OF THE INVENTION

Therefore, it is an object of the present invention to limit saturation in circuits.

It is another object of the present invention to limit saturation in TTL circuits.

Another object of the present invention is to prevent saturation in TTL circuits using the techniques that are compatible with the fabrication of the transistors in the TTL circuit and which require very little chip real estate.

DESCRIPTION OF THE DRAWINGS

These and other objects, features and advantages of the invention will be apparent from the following more particular description of the preferred embodiments of the invention as illustrated in the accompanying drawings, of which:

FIG. 1 shows a conventional TTL circuit which, in accordance with the present invention, has been supplemented with a saturation control feedback device. The saturation control is obtained by providing the input transistor 10 with an additional emitter $e_0$ which is coupled to the collector of the output transistor 14.

In this circuit, with any one or more of three inputs A, B or C down the emitters $e_1$, $e_2$ or $e_3$ coupled to the down inputs are forward biased. For instance, assume that input B is at the down level and the inputs A and C are at the up level so that emitter $e_2$ is forward biased and emitters $e_1$ and $e_3$ are back biased. Then the current flowing through resistor 12 flows out of the input B through the base-emitter junction $e_2$ of transistor 10. This prevents the current from reaching the base of transistor 14 through the base-collector junction of transistor 10 so that transistor 14 remains biased off and the output voltage $V_0$ is at an up level. However, when all the inputs A, B and C are at an up level the emitters $e_1$ to $e_3$ are back biased so that current then flows to the base of transistor 14 turning transistor 14 on and dropping the voltage at the output.

Without the feedback path of emitter $e_0$ of transistor 10, the output transistor 14 would become heavily saturated by the base current supplied, through transistor 10. When saturation of transistor 14 occurs and when one of the outputs A to C is thereafter dropped to a down level, it takes time for transistor 14 to recover and turn off thus slowing the response time of the circuit. With the present invention, the saturation of transistor 14 is overcome by the coupling of the collector of transistor 14 to the emitter $e_0$ of transistor 10. Now, when the voltage at the collector of transistor 14 drops sufficiently, as it is driven by the current from transistor 10, the emitter $e_0$ will conduct causing the drive current from transistor 10 to be shunted by the base-collector junction of transistor 14 through the base-emitter junction of transistor 10. Therefore, transistor 14 is not driven into saturation by the drive current and recovers rapidly when any one of the inputs A, B or C is lowered.

Figure 1:
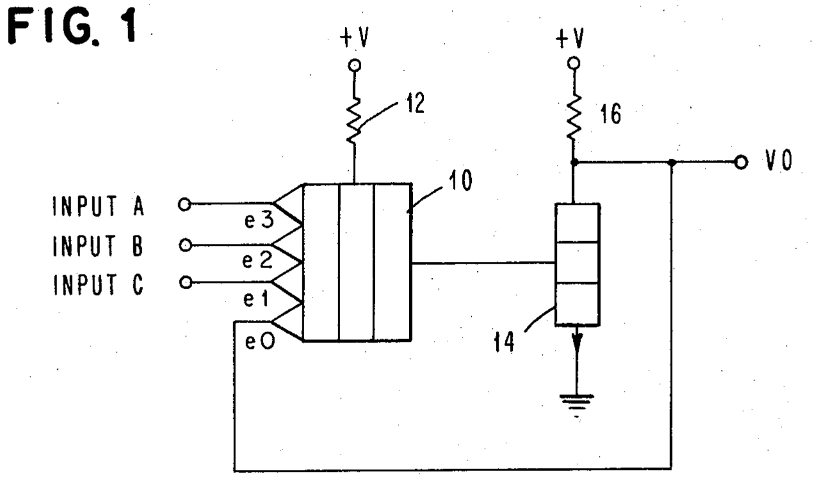
FIG. 1 is a schematic of a TTL circuit embodying the present invention.
Figure 2:
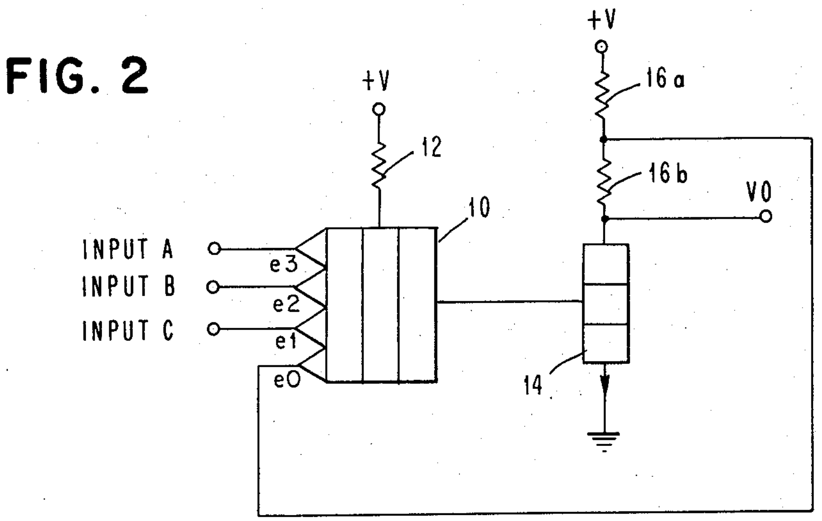
FIG. 2 is a schematic of another TTL circuit embodying the present invention.

A difficulty with the circuit shown in FIG. 1 is that the down output of the circuit in some cases may not be sufficient to activate an emitter diode of the next stage TTL circuit. To overcome this problem, the circuit of FIG. 2 is proposed. Here the output resistor 16 is divided into portions **16*a* or 16*b* and the emitter $e_0$ is coupled to the junction of these two resistors while the output is still taken off the collector of the output transistor 14**. It can be seen now that the output $V_{OUT}$ will be significantly below the potential necessary to cause the emitter $e_0$ to conduct and, therefore, will be sufficiently low to cause the emitters on the following stages of the circuit to conduct.

Figure 3:
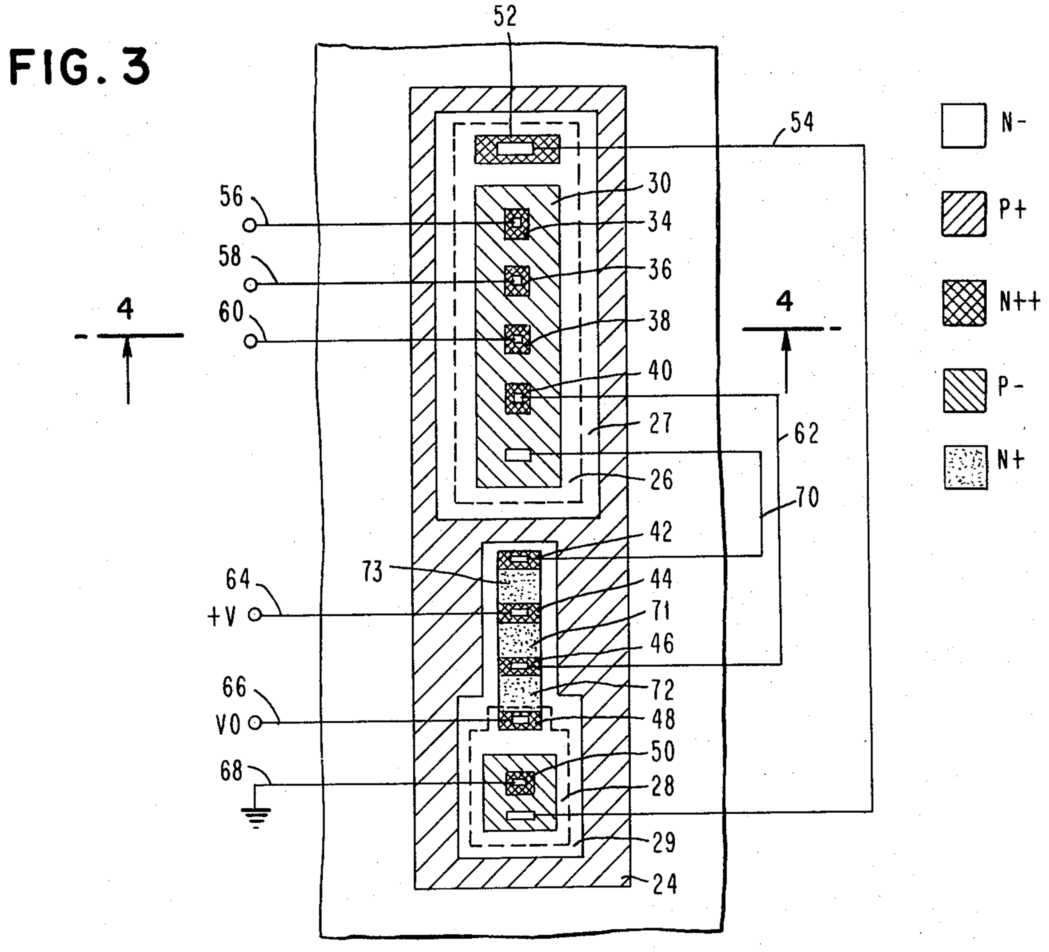
FIG. 3 is a plan view of a monolithic layout of the circuit in FIG. 2.
Figure 4:
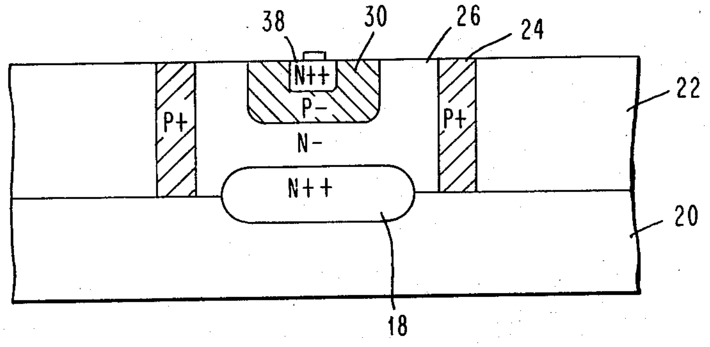
FIG. 4 is a section taken along line 4—4 in FIG. 3.

A possible monolithic chip layout for the two transistors and the resistors of the circuit of FIG. 2 is shown in FIGS. 3 and 4. In this layout an N+ subcollector diffusion 18 is placed onto a P substrate 20 and an N epitaxial layer 22 is then grown thereover. A P+ isolation diffusion 24 is thereafter placed into the epitaxial layer to define the rectangular (27) and T-shaped (29) areas of epitaxial material. The rectangular area 26 serves as the collector for the input transistor 10 while the T-shaped area 28 serves as the collector for the output transistor 14 and as the resistances 12 and **16*a* and 16*b*. Rectangular P− diffusions 30 and 32 are then placed in the areas 26 and 28 to serve as the base diffusions of transistors 10 and 14, respectively. Thereafter a number of N+ and N++ diffusions 34–52 are made in the rectangular and T-shaped areas. Diffusions 34–48 serve as the input emitters for transistor 10 while diffusion 40 serves as the feedback emitter for transistor 10. Diffusions 42–48 serve as the contact diffusions for the resistors, diffusion 50 serves as the emitter diffusion for transistor 14, diffusions 71–73 serve as resistor elements and finally, diffusion 52 serves as the collector contact diffusion for transistor 10. Metalization is thereafter provided to couple the various elements into the circuit shown in FIG. 2. As can be seen, one metalization path 54 couples the collector of transistor 10 to the base of transistor 14. Metalization paths 56–60 serve as the input lines for transistor 10 while metalization path 62 provides the feedback coupling between the emitter $e_0$ and the common point for resistors 16*a* and 16*b*. Paths 64–68 are for the connections to the positive source, to the output $V_0$ and to ground potential respectively and the final illustrated connection 70 couples the base of transistor 10 to the resistor 12**.

Therefore, while the invention has been shown and described with respect to preferred embodiments thereof, it will be understood by those skilled in the art that various changes in form and detail may be made therein without departing from the spirit and scope of the invention.

What is claimed is:

1. A transistor circuit which does not go into saturation, comprising:

a driven transistor arranged in common emitter configuration so that the base of the transistor receives drive current and an output for the circuit is taken off the collector for the driven transistor;

a multi-emitter transistor with the collector connected to the base of the driven transistor and emitters serving as individual inputs for the circuit;

a current source coupled to the base of the multi-emitter transistor so that when any of the emitters serving as inputs are biased down current from the current source does not reach the base of the driven transistor and when all of the collectors are biased up current from the current source is supplied to the base of the driven transistor; and an additional emitter on said multi-emitter transistor which is coupled to the collector of the driven transistor so that said additional emitter becomes forward biased when the collector of the driven transistor drops sufficiently and which is resistively separated from the output of the circuit so that the output of the circuit is lower in potential than the potential at the additional emitter whereby the driven transistor is prevented from going into saturation.

2. The structure of claim 1 wherein the output and the additional emitter are connected to spaced points on the collector of the driven transistor.

* * * * *